United States Patent [19]

Kawamura

[11] Patent Number: 5,402,080
[45] Date of Patent: Mar. 28, 1995

[54] METHOD OF MEASURING UNSATURATED INDUCTANCES OF AN EQUIVALENT CIRCUIT OF A SYNCHRONOUS MACHINE

[75] Inventor: Mitsuhiro Kawamura, Tokyo, Japan

[73] Assignee: Mitsubishi Denki Kabushiki Kaisha, Tokyo, Japan

[21] Appl. No.: 204,512

[22] Filed: Mar. 2, 1994

Related U.S. Application Data

[62] Division of Ser. No. 928,347, Aug. 12, 1992, Pat. No. 5,309,089.

[30] Foreign Application Priority Data

Nov. 12, 1991 [JP] Japan .................. 3-322436

[51] Int. Cl.$^6$ .......................................... G01R 31/24
[52] U.S. Cl. .......................................... 324/772
[58] Field of Search .............. 324/158 MG, 158 SY, 324/547, 545, 772; 340/648; 364/481, 578; 318/490; 322/99

[56] References Cited

U.S. PATENT DOCUMENTS

| | | | |
|---|---|---|---|
| 4,714,878 | 12/1987 | Steinigeweg | 324/158 MG |
| 4,763,058 | 8/1988 | Heining et al. | 324/158 MG |
| 4,945,508 | 7/1990 | Bénéjean | 364/578 |
| 5,202,620 | 4/1993 | Kawamura | 324/158 MG |

FOREIGN PATENT DOCUMENTS

56-82469  7/1981  Japan .
59-169394 9/1984  Japan .

OTHER PUBLICATIONS

"The Extended Slip Method for Measuring Synchronous Machine Constants", *The Transactions of the Institute of Electrical Engineers of Japan*, vol. 97-B, No. 5, May, 1977, pp. 287-293.

*JEC-114 Synchronous Machine*, published by the Institute of Electrical Engineers of Japan, 1979, pp. 72-89.

C"Part 4: Methods for Determining Synchronous Machine Quantities from Tests", *IEC Standard Publication 34-4*, Geneva, Switzerland, 1985.

*Primary Examiner*—Vinh Nguyen
*Attorney, Agent, or Firm*—Burns, Doane, Swecker & Mathis

[57] ABSTRACT

Unsaturated inductances of an equivalent circuit of a synchronous machine are measured from the following steps: An armature resistance of a synchronous machine is measured. A time constant of an armature with damper under a quadrature-axis magnetomotive force is measured when an armature and a field are in a positional relationship wherein a magnetomotive force by flowing current to an armature coil of the synchronous machine becomes the quadrature-axis magnetomotive force. Also, a current and a voltage of the armature are measured when the armature and the field are in the positional relationship by a quadrature-axis Dalton-Cameron method. The measured values are then used for solving equations defining inductances of a quadrature-axis equivalent circuit of the synchronous machine.

1 Claim, 9 Drawing Sheets

FIGURE 8

| FOUR KINDS OF MEASUREMENT | MEASUREMENT ITEM | NOTATION (UNIT) | MEASURING INSTRUMENTS |
|---|---|---|---|
| NO-LOAD SATURATION CHARACTERISTIC | ARMATURE LINE VOLTAGE | Vbco (Vrms) | AC VOLTMETER |
|  | ARMATURE VOLTAGE FREQUENCY | fo (Hz) | FREQUENCY INDICATOR |
|  | FIELD CURRENT | Ifo (A) | DC AMMETER |
| THREE-PHASE SHORT-CIRCUIT CHARACTERISTIC | ARMATURE CURRENT | Ias (Arms) | AC AMMETER |
|  | FIELD CURRENT | Ifs (A) | DC AMMETER |
| OPEN-CIRCUIT FIELD DIRECT-AXIS DALTON-CAMERON METHOD | VOLTAGE APPLIED BETWEEN BC PHASES | Vbc1 (Vrms) | AC VOLTMETER |
|  | CURRENT FLOW BETWEEN BC PHASES | Ibc1 (Arms) | AC AMMETER |
|  | FREQUENCY OF APPLIED VOLTAGE | f1 (HZ) | FREQUENCY INDICATOR |
|  | VOLTAGE INDUCED IN FIELD COIL | Vf1 (Vrms) | AC VOLTMETER |
| SHORT-CIRCUIT DIRECT-AXIS DALTON-CAMERON METHOD | CURRENT FLOWN BETWEEN BC PHASES | Ibc2 (Arms) | AC AMMETER |
|  | CURRENT INDUCED IN FIELD COIL | If2 (Arms) | AC AMMETER |

FIGURE 9
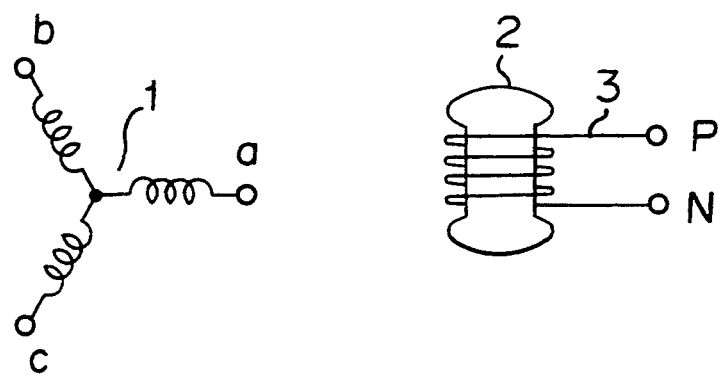
*EQUIVALENT*
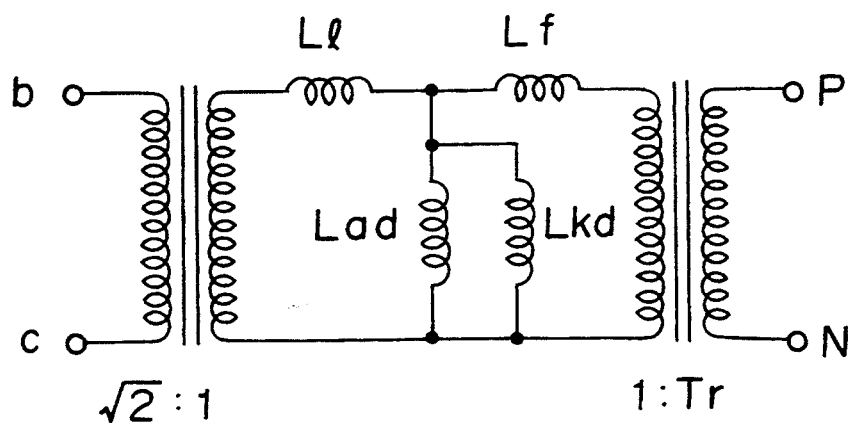

FIGURE 16
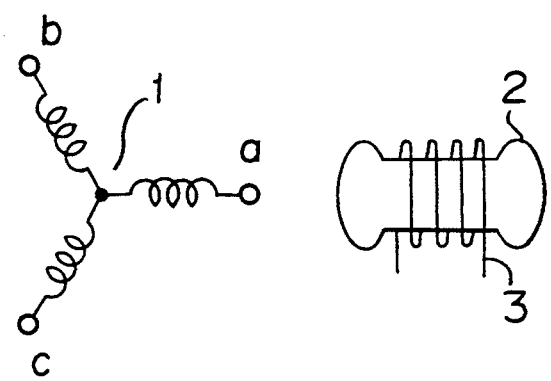
*EQUIVALENT*
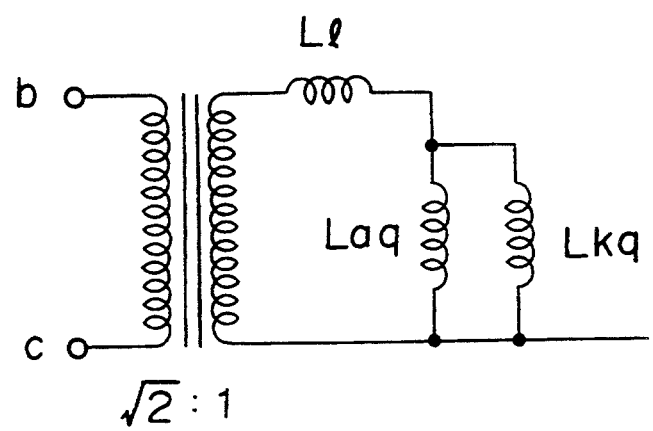

METHOD OF MEASURING UNSATURATED INDUCTANCES OF AN EQUIVALENT CIRCUIT OF A SYNCHRONOUS MACHINE

This application is a divisional of application Ser. No. 07/928,347, filed Aug. 12, 1992, now U.S. Pat. No. 5,309,089, issued on May 3, 1994.

BACKGROUND OF THE INVENTION

1. Field of the Invention

This invention relates to a method of measuring unsaturated inductances of an equivalent circuit of a synchronous machine for obtaining unsaturated values of inductances in the equivalent circuit of a synchronous machine.

2. Discussion of Background

A synchronous machine is mainly utilized as a generator or a motor always running at a predetermined revolution number. Reactances in these machines are generally utilized for calculating a limit of an output, a stability or the like. Accordingly, an inductance (inductance multiplied by $2\pi f$ is reactance) treated as a value viewed from an armature such as a synchronous reactance or a transient reactance, attracts attention.

For instance, various test methods are described in "the Abstract of Test Methods for a Synchronous Machine (Parts 1 to 4)" (issued by the Institute of Electrical Engineers of Japan) summarizing test methods of the synchronous machine, for measuring inductances of the synchronous machine. However, no description is found in the abstract concerning a method of measuring values of elements constituting an equivalent circuit of the synchronous machine, such as an armature leakage inductance, a field leakage inductance, a direct-axis damper leakage inductance, a direct-axis armature reaction inductance, a quadrature-axis damper leakage inductance and a quadrature-axis armature reaction inductance, based on a unified theory.

Accordingly, these values are obtained by combining known methods, when the values of the respective elements constituting the equivalent circuit of the synchronous machine are necessary. For instance, one method is as follows.

First, a direct-axis synchronous reactance is obtained based on results of a no-load saturation characteristic test and a three-phase short-circuit characteristic test. The direct-axis armature reaction reactance is determined by subtracting a value of the armature leakage reactance from the above value. In this occasion, an assumed value is often adopted as the value of the armature leakage reactance. To actually measure the armature leakage reactance, it is necessary to draw out a rotor thereof and provide additional wirings, which requires considerable time and labor.

Next, a direct-axis transient reactance is obtained by a three-phase sudden short-circuit test. A parallel value of the direct-axis armature reaction reactance and the field leakage reactance is obtained by the above value substracted by the value of the armature leakage reactance. Furthermore, the field leakage reactance is separated from the parallel value.

Similarly, a direct-axis initial transient reactance is obtained by the three-phase sudden short-circuit test. A parallel value of the direct-axis armature reaction reactance, the field leakage reactance and the direct-axis damper leakage reactance is obtained by subtracting the value of the armature leakage reactance from the above value. Furthermore, the direct-axis damper leakage reactance is separated from the parallel value.

The respective reactances concerning the quadrature-axis, are obtained as follows. First, a quadrature-axis synchronous reactance is obtained by a measurement result by the slip method. The quadrature-axis armature reaction reactance is determined by subtracting the value of the armature leakage reactance from the above value.

Next, a quadrature-axis initial transient reactance is obtained by a measurement result by Dalton-Cameron method. A parallel value of the quadrature-axis armature reaction reactance and a quadrature-axis damper leakage reactance is obtained by subtracting the value of the armature leakage reactance from the above value. Furthermore, the quadrature-axis leakage reactance is separated from the parallel value.

In the meantime, there is a vector control capable of controlling with high accuracy, as a control method of the synchronous machine. To perform the vector control, it is necessary to set detailed values of the respective elements constituting the equivalent circuit of the synchronous machine to a control device, as motor constants. Accordingly, in cases of driving the synchronous machine by the vector control, the respective reactance values has previously been obtained by the above method, which are set to the control device.

Since the method of measuring unsaturated inductances of the equivalent circuit of the synchronous machine, is as above, the high accuracy of the respective reactance values can not be expected. That is, the above method is a combination of available measuring methods such as in measuring the no-load saturation characteristic, which is not a method based on a unified theory. Accordingly, it is impossible to investigate influence of the respective values on a total measurement accuracy.

Furthermore, since the actual measurement of the armature leakage reactance is not easy, an assumed value is apt to be adopted as the value, which causes lowering of the measurement accuracy. Furthermore, the synchronous machine having a large capacity controlled by the vector control, is often driven at a rated frequency of about 2 to 10 Hz. In case of such a low rated frequency, as a result of the three-phase sudden short-circuit test, a number of waves contained in a waveform becomes less, and it becomes difficult to read the direct-axis transient reactance and the direct-axis initial transient reactance from the waveform.

Furthermore, to carry out the slip method test, it is necessary to drive the rotor at a speed slightly different from a speed of a revolving field of a stator. Accordingly, when a size of the synchronous machine which is an object of the test, is enlarged, a three-phase power source on the side of the stator, a driving motor on the side of the rotor and the like become large-scale ones. In performing the test, a skilled driving operation is required to stably maintain a low slip. A pulsation in a revolution number caused by an influence of a reaction torque, or a too much slip causes measurement errors.

In the conventional method stated as above, there is a high possibility of containing errors in the measurement values. Furthermore, much labor and time are required in the measurement.

When the motor constants of the control device in the vector control, are to be set, optimum values should be set since the set values considerably influence on accuracy of a control calculation. Since the accuracy of the measurement value by the above method, is poor, an operation of setting optimum motor constants by repeating a driving operation wherein the control device and the synchronous machine are combined, is required. The time and the expense required for the operation are enormous in case of a large capacity machine.

SUMMARY OF TEE INVENTION

It is an object of the present invention to solve the above problems. It is an object of the present invention to provide a method of measuring unsaturated inductances of an equivalent circuit of a synchronous machine capable of accurately obtaining the unsaturated values of inductances of respective elements constituting the equivalent circuit, and as a result, capable of determining the motor constants to be given to the control device of the vector control by a single body test of the synchronous machine.

According to a first aspect of the present invention, there is provided a method of measuring unsaturated inductances of an equivalent circuit of a synchronous machine comprising:

measuring a no-load saturation characteristic of a synchronous machine;

measuring a three-phase short-circuit characteristic of the synchronous machine;

measuring currents and voltages of an armature and a field when an armature coil and a field coil are in a positional relationship wherein a magnetomotive force by flowing current to the armature coil of the synchronous machine becomes a direct-axis magnetomotive force and both when the field coil is in an open-circuit state and when the field coil is in a short-circuit state by direct-axis Dalton-Cameron method; and solving simultaneous equations concerning a direct-axis equivalent circuit of the synchronous machine by using results of the measuring the no-load saturation characteristic, the measuring the three-phase short-circuit characteristic and the measuring by the direct-axis Dalton-Cameron method, thereby obtaining impedances of respective elements constituting the direct-axis equivalent circuit.

According to a second aspect of the present invention, there is provided a method of measuring unsaturated inductances of an equivalent circuit of a synchronous machine comprising:

measuring an armature resistance of a synchronous machine;

measuring a time constant of an armature with damper under a quadrature-axis magnetomotive force when an armature and a field is in a positional relationship wherein a magnetomotive force by flowing current to an armature coil of the synchronous machine becomes the quadrature-axis magnetomotive force;

measuring a current and a voltage of the armature when the armature and the field are in said positional relationship by a quadrature-axis Dalton-Cameron method;

solving calculating equations concerning a quadrature-axis equivalent circuit of the synchronous machine by using results of the measuring the armature resistance, the measuring the time constant of the armature with damper under the quadrature-axis magnetomotive force and the measuring by the quadrature-axis Dalton-Cameron method, thereby obtaining inductances of respective elements constituting the quadrature-axis equivalent circuit.

The respective measuring steps in the first aspect of the present invention, can be performed in a steady state, that is, without reading timewisely variable data. Therefore, a possibility of containing errors in the measurement result is reduced. The measuring steps by the direct-axis Dalton-Cameron method can be performed in a stationary state of the synchronous machine. The performing difficulty is inconsiderable and the measurement error due to a variation in the revolution number and an error in the revolution number, are avoided.

Furthermore, in the respective measuring steps in the second aspect of the present invention, it is possible to perform the measurements at a stationary state of the synchronous machine, thereby avoiding the measurement error due to a variation in the revolution number and an error in the revolution number.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is an explanatory diagram showing measurement items with the respect to the direct-axis;

FIG. 9 is an explanatory diagram showing a direct-axis equivalent circuit of the synchronous machine;

FIG. 16 is an explanatory diagram showing a quadrature-axis equivalent circuit of the synchronous machine.

DETAILED DESCRIPTION OF THE PREFERRED EMBODIMENTS

EXAMPLE 1

Explanation will be given to an embodiment of the present invention as follows.

Figure 1:
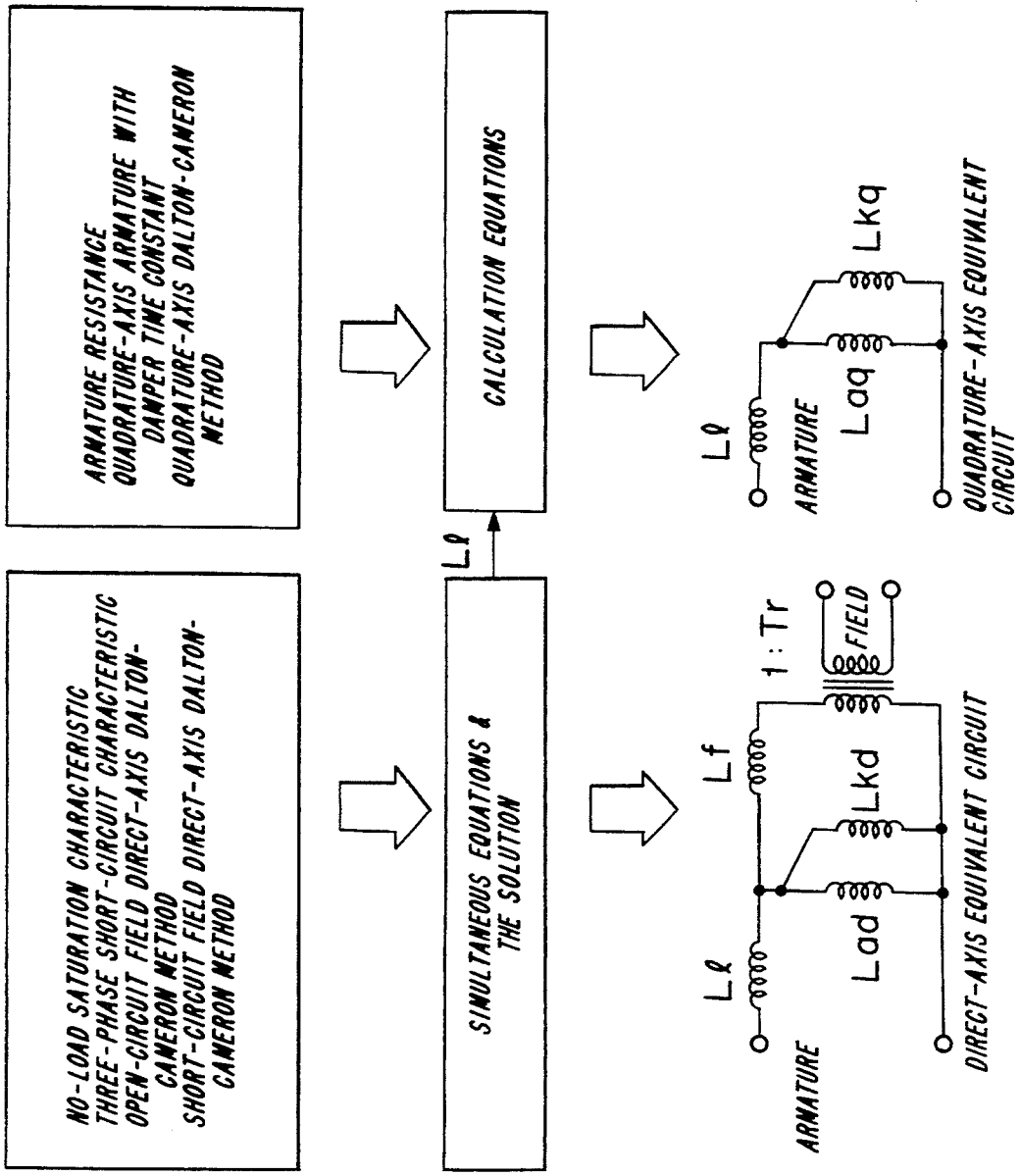
FIG. 1 is an explanatory diagram showing a total flow of a method of obtaining inductances of respective elements constituting a direct-axis equivalent circuit and a quadrature-axis equivalent circuit.

FIG. 1 is an explanatory diagram showing a total flow of a method of obtaining inductances of respective elements constituting a direct-axis equivalent circuit and a quadrature-axis equivalent circuit.

FIG. 1 shows that values of the inductances of the respective elements constituting a direct-axis equivalent circuit can be obtained by measuring a no-load saturation characteristic, measuring a three-phase short-circuit characteristic, measuring by a direct-axis Dalton-Cameron method under a condition of open-circuit of a field and measuring by the direct-axis Dalton-Cameron method under a condition of short-circuit of the field, and by solving simultaneous equations concerning the direct-axis equivalent circuit.

Furthermore, FIG. 1 shows that values of inductances of respective elements constituting a quadrature-axis equivalent circuit can be obtained, by measuring an armature resistance, measuring a time constant of the quadrature-axis armature with damper, measuring by quadrature-axis Dalton-Cameron method, and by solving calculating equations concerning the quadrature-axis equivalent circuit.

In this specification, the "armature with damper" signifies that a damper is magnetically coupled with the armature. In the quadrature-axis equivalent circuit, the damper is parallelly connected to the quadrature-axis armature reaction inductance $L_{aq}$.

Figure 2:
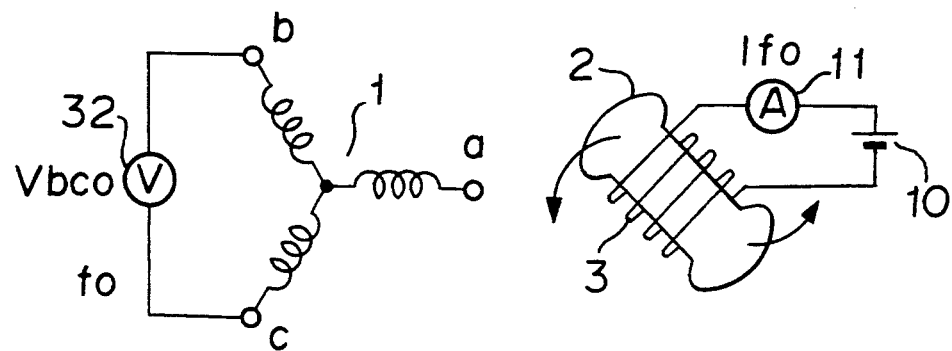
FIG. 2 is a circuit diagram showing a measurement circuit for measuring a no-load saturation characteristic.

Next, explanation will be given to the measurement of the inductances concerning the direct-axis equivalent circuit referring to the drawings. FIG. 2 shows a measurement situation of the no-load saturation characteristic. In FIG. 2, a reference numeral 1 designates an armature coil, 2, a rotor (field), 3, a field coil, 10, a direct current power source, 11, an ammeter (D.C.) connected to the field coil 3, and 32, an alternating current voltmeter connected between the "b" phase and the "c" phase of the armature coil 1.

Figure 3:
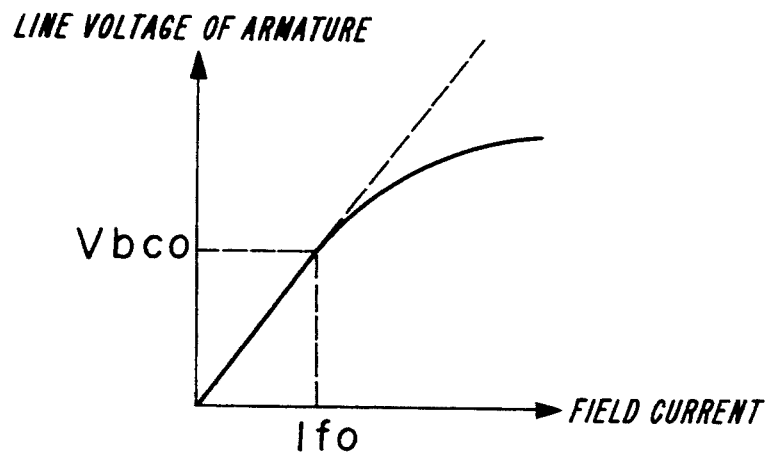
FIG. 3 is a characteristic diagram showing the no-load saturation characteristic.

In this case, the rotor 2 is driven at a constant speed, normally at a rated revolution number of the synchronous machine. Under the condition, a line voltage $V_{bc0}$ which is induced in the armature coil 1 in an open-circuit state by excitation by a field current $I_{f0}$, and a frequency $f_0$ are measured respectively by the alternating current voltmeter 32 and a frequency indicator (not shown) (refer to FIG. 8). FIG. 3 shows a no-load saturation characteristic. In this case, unsaturated values of the line voltage $V_{bc0}$ and the field current $I_{f0}$ are adopted in a range wherein the characteristic is regarded as approximately linear.

Figure 4:
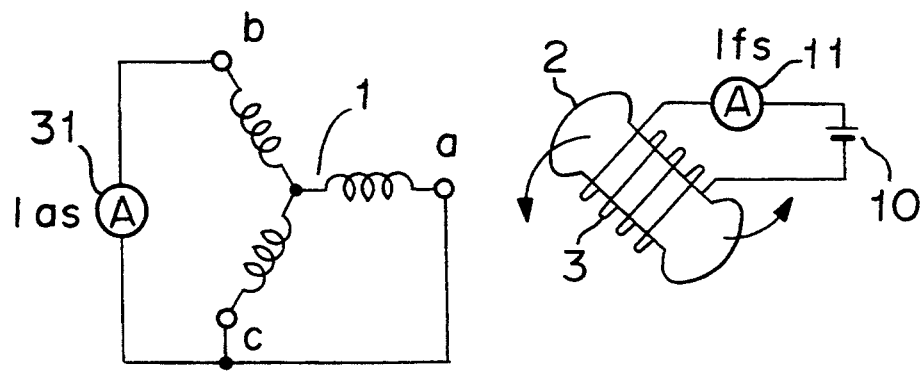
FIG. 4 is a circuit diagram showing a measurement circuit for measuring a three-phase short-circuit characteristic.

FIG. 4 shows a measurement situation of the three-phase short-circuit characteristic. In FIG. 4, a reference numeral 31 designates an alternating current ammeter connected among the "b" phase, the "c" phase and the "a" phase of the armature coil 1. In this case, the rotor 2 is driven at a constant speed, normally at a rated revolution number of the synchronous machine. Under the condition, a current $I_{as}$ which is induced in the armature coil 1 in a short-circuit state by excitation by a field current $I_{fs}$, is measured (refer to FIG. 8).

Figure 5:
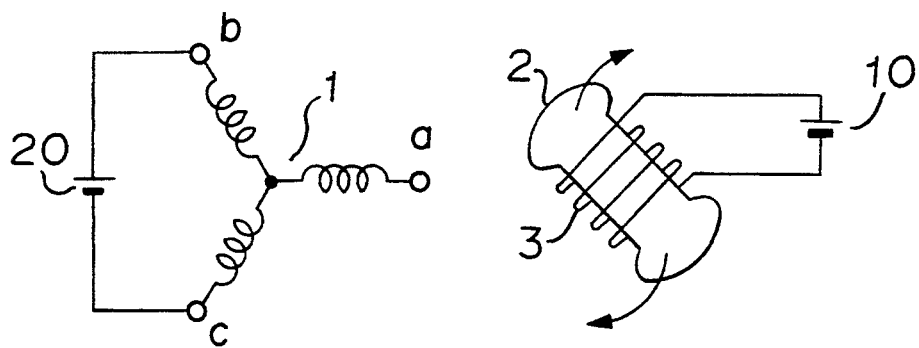
FIG. 5 is a circuit diagram showing a circuit for preparing to perform a direct-axis Dalton-Cameron method.

FIG. 5 shows a situation of preparing to perform the direct-axis Dalton-Cameron method. In this case, a direct current flows from the "b" phase to the "c" phase of the armature coil 1 by a direct current power source 20. At the same time, a direct current flows in the field coil 3. Then, the rotor 2 rotates to a position wherein the stator and the rotor 2 pull together by a magnetic force, and is fixed there. That is, the rotor 2 is fixed to a position, for instance, shown in FIGS. 6 and 7.

Figure 6:
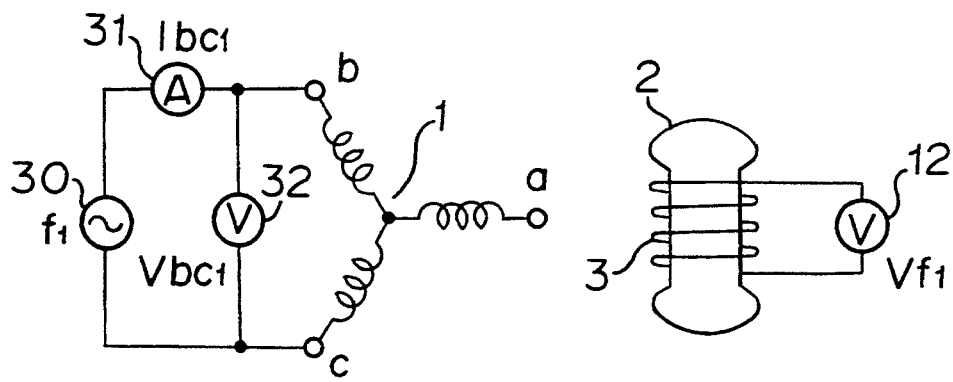
FIG. 6 is a circuit diagram showing a measurement circuit by the direct-axis Dalton-Cameron method under a condition of open-circuit of a field coil.
Figure 7:
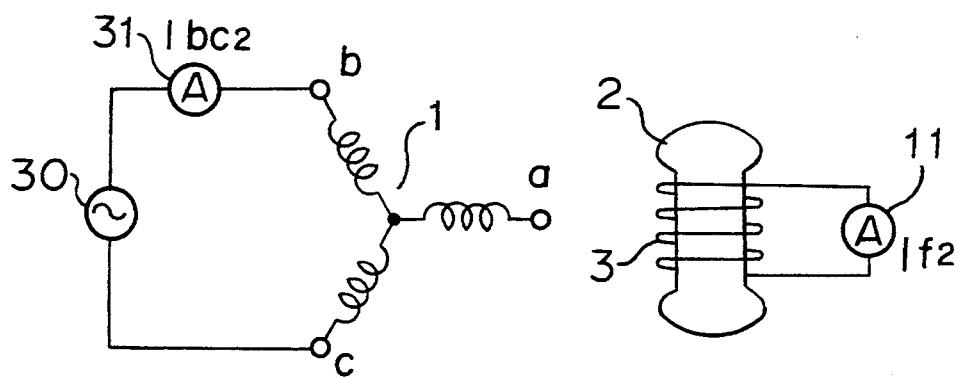
FIG. 7 is a circuit diagram showing a measurement circuit for measuring by the direct-axis Dalton-Cameron method under a condition of short-circuit of the field coil.

When the rotor 2 is situated at the position shown in FIGS. 6 and 7, and when a current flows from the "b" phase to the "c" phase of the armature coil 1, a magnetomotive force by the current flowing is a direct-axis magnetomotive force. Accordingly, as shown in FIG. 5, when currents start flowing in the armature coil 1 and the field coil 2, and when it is confirmed that the rotor 2 strongly rotates to the stable position shown in FIGS. 6 and 7, a current flows from the "b" phase to the "c" phase in a stationally state of the rotor. In this way, values with respect to the direct-axis are measured wherein they are clearly defined, which is different from the conventional measurement by the Dalton-Cameron method performed at an arbitral position of the rotor.

FIG. 6 shows a measurement situation under a condition of open-circuit of the field coil 3. That is, an alternating current having frequency of $f_1$ flows from the "b" phase to the "c" phase of the armature coil 1 by an alternating current power source 30. A current $I_{bc1}$ flowing from the "b" phase to the "c" phase, a voltage $V_{bc1}$ between the "b" phase and the "c" phase and a voltage $V_{f1}$ induced in the field coil 3 are respectively measured by the alternating current ammeter 31, the alternating current voltmeter 32 and an alternating current voltmeter 12 (refer to FIG. 8).

FIG. 7 shows a measurement situation under a condition wherein the field coil 3 is shortcircuited. That is, an alternating current flows from the "b" phase to the "c" phase of the armature coil 1. A current $I_{bc2}$ flowing from the b phase to the "c" phase and a current $I_{f2}$ induced in the field coil 3 are respectively measured by the alternating current ammeter 31 and an ammeter (A.C.) 11 (refer to FIG. 8).

In these measurements by the direct-axis Dalton-Cameron method, it is preferable to utilize 50 Hz or 60 Hz as the frequency $f_1$ in a large capacity machine. However, the frequency may be chosen in a range of 10 to 100 Hz. The currents $I_{bc1}$ and $I_{bc2}$ flowing between the "b" phase and the "c" phase of the armature coil 1 are preferable to be about 10 to 20% of the rated current value. FIG. 8 summarizes measurement items and utilized measuring instruments with respect to the above-mentioned measurements. An order of the above-mentioned four items of the measurements can arbitrarily be chosen.

FIG. 9 shows an equivalent circuit of the synchronous machine when the rotor 2 is at the position shown in FIGS. 6 and 7. When the equivalent circuit is to be represented by equations, the following simultaneous equations are obtained.

$$Tr = \frac{I_{as} \times \sqrt{3}}{I_{fs}} \times \frac{Ll + L_{ad}}{L_{ad}}$$

$$L_{md} = \frac{V_{f1}}{Tr \times 2\pi f_1 \times I_{bc1} \times \sqrt{2}}$$

-continued $$L_l = \frac{V_{bc1}}{\sqrt{2} \times 2\pi f_1 \times I_{bc1} \times \sqrt{2}} - L_{md}$$

$$L_f = \frac{I_{bc2} \times \sqrt{2} \times L_{md}}{I_{f2} \times T_r} - L_{md}$$

$$L_{ad} = \frac{V_{bc0}}{2\pi f_0 \times I_{f0} \times T_r}$$

$$L_{kd} = \frac{1}{\frac{1}{L_{md}} - \frac{1}{L_{ad}}} \left[ \frac{1}{L_{md}} = \frac{1}{L_{ad}} + \frac{1}{L_{kd}} \right]$$

By inputting the measurement results shown in FIG. 8 into the simultaneous equations, and by solving with respect to the unknown, four direct-axis unsaturated inductances, that is, the armature leakage inductance $L_l$, the field leakage inductance $L_f$, the direct-axis damper leakage inductance $L_{kd}$ and the direct-axis armature reaction inductance $L_{ad}$, and a turn ratio $T_r$ between the equivalent circuit and the actual field coil 3, can be obtained.

The simultaneous equations can be solved by a numerical calculation method. For instance, by using Gauss-Seidel iteration method, the calculation converges by iterations of about five times.

EXAMPLE 2

Figure 10:
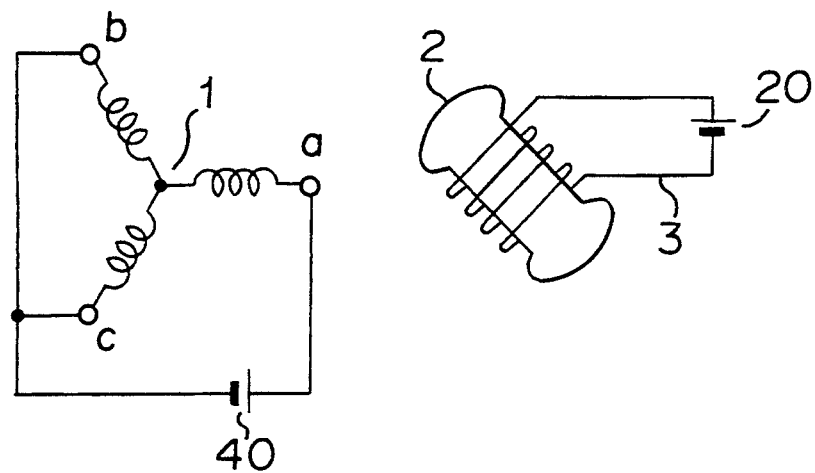
FIG. 10 is a circuit diagram for showing a circuit for preparing to measure a time constant of a quadrature-axis armature with damper and to perform a quadrature-axis Dalton-Cameron method.

Next, explanation will be given to the measurement of inductances with respect to the quadrature-axis equivalent circuit referring to the drawings. FIG. 10 shows a situation of preparing to perform measurements of a time constant of the quadrature-axis armature with damper and by the quadrature-axis Dalton-Cameron method. In this case, the "b" phase and the "c" phase of the armature coil 1 are shortcircuited, and a direct current flows from the "a" phase to the "b" phase and the "c" phase by a direct current power source 40. At the same time, a direct current flows in the field coil 3.

Then, the rotor 2 rotates to a position wherein the stator and the rotor 2 pull together, and fixed there. That is, the rotor 2 is fixed to, for instance, a position shown in FIG. 11. When a current flows from the "a" phase to the "b" phase and the "c" phase of the armature coil 1, while the rotor 2 stays at that position, the magnetomotive force by the current flowing is a direct-axis magnetomotive force. On the contrary, when a current flows from the "b" phase to the "c" phase, the magnetomotive force by the current flowing is a quadrature-axis magnetomotive force.

Figure 11:
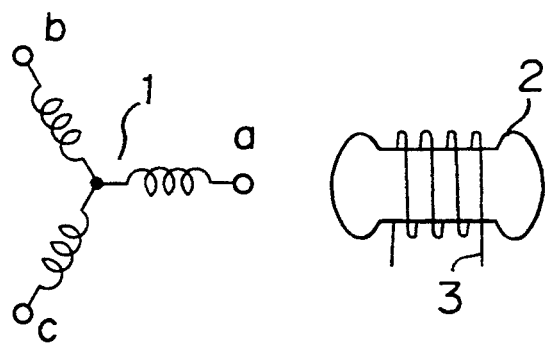
FIG. 11 is an explanatory diagram showing a positional relationship between an armature and a rotor.

Accordingly, when it is confirmed that currents start flowing in the armature coil 1 and the field coil 2 as shown in FIG. 10, and the rotor 2 strongly rotates and stops at a stable position shown in FIG. 11, a current is to flow from the "b" phase to the "c" phase in a stationary state of the rotor. In this way, the measurement of the inductances with respect to the quadrature-axis becomes possible.

Figure 12:
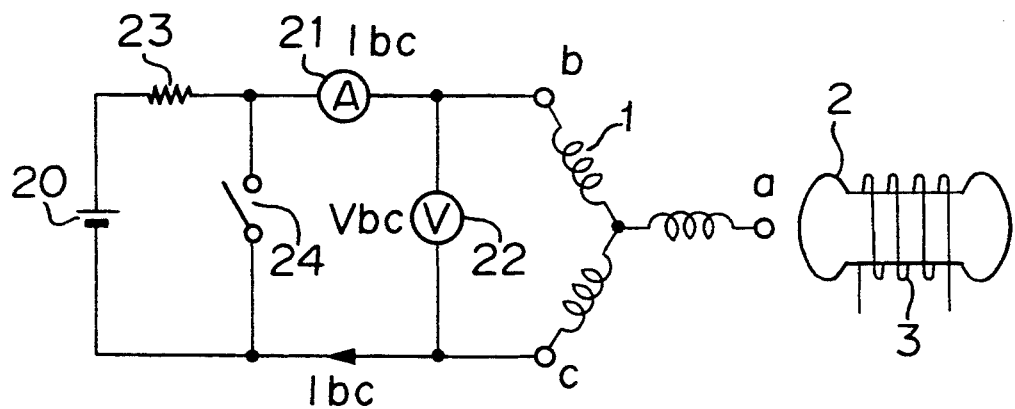
FIG. 12 is a circuit diagram showing a measurement circuit for measuring an armature resistance and a time constant of a quadrature-axis armature with damper.

FIG. 12 shows a situation wherein a current flows from the "b" phase to the "c" phase of the armature coil 1 by opening a switch 24. In this situation, a current $I_{bc}$ flowing from the "b" phase to the "c" phase and a voltage $V_{bc}$ between the "b" phase and the "c" phase are respectively measured by a direct current ammeter 21 and a direct current voltmeter 22 (refer to FIG. 15).

Accordingly, an armature resistance $R_{bc}$ can be determined by the following equation.

$$R_{bc} = \frac{V_{bc}}{I_{bc}}$$

Figure 13:
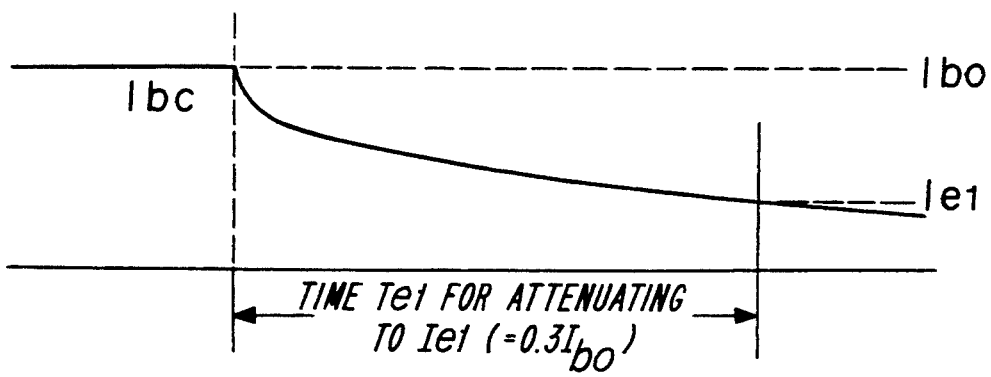
FIG. 13 is a waveform diagram showing a waveform of an armature current when the time constant of the quadrature-axis armature with damper, is measured.

Next, when a situation shown in FIG. 12, that is, the situation wherein a current flows from the "b" phase to the "c" phase, is changed to a situation wherein the "b" phase and the "c" phase are shortcircuited by closing the switch 24, the current $I_{bc}$ recirculates in the armature coil 1 and attenuates by the armature resistance and by an influence of a quadrature-axis damping effect. FIG. 13 shows an actually measured waveform of the current $I_{bc}$ by an oscilloscope. By the way, a resistance 23 connected in series to the direct current power source 20 in FIG. 12, designates a protection resistance for preventing the direct current power source 20 from the short-circuit when the switch 24 is closed, and for short-circuiting only the armature coil.

As shown in FIG. 13, the current $I_{bc}$ rapidly falls just after the short-circuit, and gradually attenuates. At this occasion, a time constant of the armature with damper is measured by a time $T_{e1}$ wherein the current $I_{bc}$ attenuates to $I_{e1}$, 30% of an initial value $I_{b0}$ (refer to FIG. 15). The time constant normally designates a time for the current $I_{bc}$ to attenuates to $1/e = 0.37$ of the initial value $I_{b0}$. However, in this measurement, the time for the current to attenuate to 0.3 of the initial value, is utilized.

The value of 0.3 is determined based on results of various experiments and simulations performed to investigate the influence of the quadrature-axis damping effect, and is an optimum value for obtaining the time constant of the quadrature-axis armature circuit which removes an influence of the quadrature-axis damper. Since the time for the current $I_{bc}$ to become $I_{e1}$ ($=0.3 I_{b0}$) is measured, actually, $-\log (I_{e1}/I_{b0}) = -\log (0.3) = 1.2$ times of the time constant $T_{adq}$ of the quadrature-axis armature circuit is measured as $T_{e1}$. However, this point is considered in the equations mentioned later.

Figure 14:
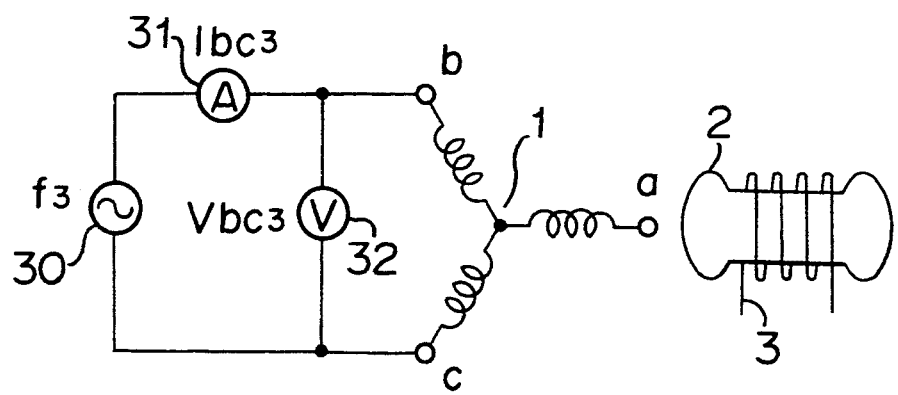
FIG. 14 is a circuit diagram showing a measurement circuit by the quaderature-axis Dalton-Cameron method.

FIG. 14 shows a situation of the measurement by the guadrature-axis Dalton-Cameron method. In this case, an alternating current having frequency of $f_3$ flows between the "b" phase and the "c" phase of the armature coil from the alternating current power source 30. A current $I_{bc3}$ and a voltage $V_{bc3}$ are measured (refer to FIG. 15).

Figure 15:
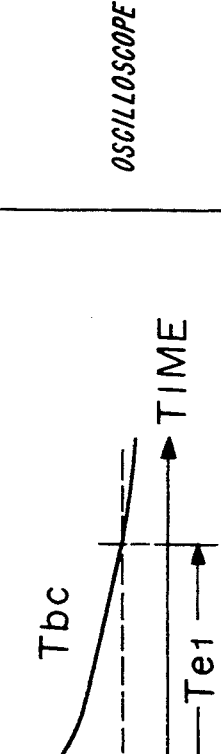
FIG. 15 is an explanatory diagram showing measurement items with respect to the quadrature-axis.

In this measurement by the quadrature-axis Dalton-Cameron method, it is preferable to utilize 50 Hz or 60 Hz as the frequency $f_3$ in case of a large capacity machine. However, the frequency may be chosen in a range of 10 to 100 Hz. The current $I_{bc3}$ flowing between the "b" phase and the "c" phase of the armature coil 1 is preferably about 10 to 20% of the rated current value. FIG. 15 summarizes measurement items and utilized measuring instruments for the measurement with respect to the above-mentioned quadrature-axis. An order of the above three measurements can arbitrarily be chosen.

FIG. 16 shows an equivalent circuit of the synchronous machine in a situation wherein the rotor 2 is at the position shown in FIGS. 11, 12 and 14. When the equivalent circuit is to be represented by mathematical formula, the following equations can be obtained.

$$T_{adq} = \frac{T_{e1}}{1.2}$$

-continued $$L_{aq} = T_{adq} \times R_{bc} \times \frac{1}{2} - L_l$$

$$L_{mq} = \frac{V_{bc3}}{4\pi f_3 \times I_{bc3}} - L_l$$

$$L_{kq} = \frac{1}{\frac{1}{L_{mq}} - \frac{1}{L_{aq}}} \left[ \frac{1}{L_{mq}} = \frac{1}{L_{aq}} + \frac{1}{L_{kq}} \right]$$

In the above equations as a value of the armature frequency inductance $L_l$, for instance, the value obtained in the first example can be utilized. By putting known values to the above equations, the two quadrature-axis unsaturated inductances, that is, the quadrature-axis damper leakage inductance $L_{kq}$ and the quadrature-axis armature reaction inductance $L_{aq}$ can be obtained.

In this way, according to Examples 1 and 2, the direct-axis unsaturated inductances and the quadrature-axis unsaturated inductances can be obtained under the unified theory. The respective measurements concerning the direct-axis unsaturated inductances can be performed in a steady state, thereby preventing generation of errors accompanied by reading the timewisely variable data. Furthermore, persons for the measurement are accustomed to the measurements of the no-load saturation characteristic and the three-phase short-circuit characteristic, since these are performed normally in all the synchronous machines. Accordingly, there is no performing difficulty and the measurements with high accuracy can be expected.

The measurements of the direct-axis inductances with the open-circuit field and the direct-axis inductances with the short-circuit field by the direct-axis Dalton-Cameron method, can be performed in a state wherein the synchronous machine is stationary. Therefore, there is little performing difficulty and little concern of generating the measurement errors due to a variation in a revolution number and an error in the revolution number.

Furthermore, the respective measurements concerning the quadrature-axis unsaturated inductances can be performed in a situation wherein the synchronous machine is stationally. Therefore, there is little performing difficulty and little concern of generating the measurement errors due to a variation in a revolution number or an error in the revolution number.

As stated above, according to the first aspect of the present invention, in the measurement method of the unsaturated inductances of the equivalent circuit of the synchronous machine, the simultaneous equations concerning the equivalent circuit are solved by measuring the no-load saturation characteristic, by measuring the three-phase short-circuit characteristic and by measuring the direct-axis inductances in the predetermined positional relationship between the armature and field by the direct-axis Dalton-Cameron method. Accordingly, the values of the inductances of the respective elements constituting the direct-axis equivalent circuit can be measured with high accuracy, and the optimum values of the motor constants to be set in the control device of the vector control can be obtained.

Furthermore, according to the second aspect of the present invention, the calculating equations concerning the equivalent circuit are solved by using the respective values obtained by measuring the armature resistance, by measuring the time constant of the quadrature-axis armature with damper in the predetermined positional relationship between the armature and the field, and by measuring the quadrature-axis inductances in the predetermined positional relationship between the armature and field by the quadrature-axis Dalton-Cameron method. Therefore, the values of the inductances of the respective elements constituting the quadrature-axis equivalent circuit can be measured with high accuracy, and the optimum values of the motor constants to be set to the control device in the vector control, can be obtained.

Furthermore, the methods both in the first and second aspects of the present invention, can be performed at a time point wherein the synchronous machine is integrated in a factory and at a stage of a factory single body test performed for the single body of the synchronous machine. As a result, steps of adjusting wherein the control device for the vector control and the synchronous motor are combined, can be omitted, thereby reducing time and cost required before starting-up of the vector control system.

Obviously, numerous modifications and variations of the present invention are possible in light of the above teachings. It is therefore to be understood that within the scope of the appended claims, the invention may be practiced otherwise than as specifically described herein.

What is claimed is:

1. A method of measuring unsaturated inductances of an equivalent circuit of a synchronous machine comprising:

measuring an armature resistance of a synchronous machine;

measuring a time constant of an armature with damper under a quadrature-axis magnetomotive force produced by flowing current to an armature coil of the synchronous machine when an armature and a field are in a positional relationship;

measuring a current and a voltage of the armature when the armature and the field are in said positional relationship by a quadrature-axis Dalton-Cameron method;

solving calculating equations concerning a quadrature-axis equivalent circuit of the synchronous machine by using results of the measuring the armature resistance, the measuring the time constant of the armature with damper under the quadrature-axis magnetomotive force and the measuring by the quadrature-axis Dalton-Cameron method, thereby obtaining inductances of respective elements constituting the quadrature-axis equivalent circuit.

* * * * *